United States Patent [19]

Tada et al.

[11] 4,259,407

[45] Mar. 31, 1981

[54] RADIATION-SENSITIVE POSITIVE RESIST

[75] Inventors: Tsukasa Tada, Yokohama; Yuzo Shimazaki, Tokyo; Masanobu Kohda, Kawasaki; Hirohisa Kato, Yokohama; Hideo Saeki, Kawasaki, all of Japan

[73] Assignee: VLSI Technology Research Association, Japan

[21] Appl. No.: 60,593

[22] Filed: Jul. 25, 1979

[30] Foreign Application Priority Data

Jul. 27, 1978 [JP] Japan ................................. 53-91769

[51] Int. Cl.³ ...................... B32B 27/16; B32B 27/30; C08F 14/18
[52] U.S. Cl. ................................ 428/421; 204/159.22; 526/245; 526/246
[58] Field of Search .............................. 526/245, 246; 204/159.22; 428/421

[56] References Cited

U.S. PATENT DOCUMENTS

| | | | |
|---|---|---|---|
| 2,877,207 | 3/1959 | Cox et al. | 526/245 |
| 3,053,815 | 9/1962 | Barr | 526/245 |

FOREIGN PATENT DOCUMENTS 52-90269  7/1977  Japan .

OTHER PUBLICATIONS

Kakuchi et al., Poly (Fluoro Methacrylate) as Highly Sensitive, High Contrast Positive Resist, 124 J. Electrochem. Soc. 1648, (1977).

*Primary Examiner*—Harry Wong, Jr.
*Attorney, Agent, or Firm*—Finnegan, Henderson, Farabow, Garrett & Dunner

[57] ABSTRACT

A radiation-sensitive positive resist which is prepared from a homogeneous polymer of any one of the various forms of halogenated alkyl α-halogenated acrylate expressed by the general structural formula:

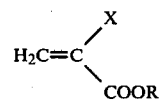

where:
X = fluorine, chlorine or bromine
R = alkyl group in which one or more hydrogen atoms are substituted by the corresponding number of fluorine atoms, or aryl group in which said substitution takes place, or alkoxy group in which said substitution takes place, or a copolymer of two or more of the monomers expressed by said general structural formula or a copolymer of any one of said monomers and any one of the different forms of vinyl monomer from those expressed by said general structural formula.

5 Claims, No Drawings

RADIATION-SENSITIVE POSITIVE RESIST

BACKGROUND OF THE INVENTION

This invention relates to a radiation-sensitive positive resist adapted for the formation of a fine pattern used in the manufacture of, for example, an integrated semiconductor device and photomask.

Hitherto, the process of forming a fine pattern for the manufacture of an integrated semiconductor device or photomask has practically been based on the application of a photoresist sensitive to visible rays or ultraviolet rays. In recent years, the technique of utilizing radiation such as electron beams, X-rays and deep ultraviolet rays has been developed to form a fine pattern for the manufacture of, for example, a semiconductor device due to demands for its high integration. As a result, various radiation-sensitive resists have been proposed. The typical radiation sensitive positive resist has been prepared from a compound belonging to a poly (alkyl methacrylate) series represented by poly(methyl methacrylate) (PMMA), or a poly(olefin-sulfone) series represented by poly(butene-1-sulfone) (PBS). However, any of the compounds hitherto used as a positive resist has been found defective in the fundamental respects and failed to be put to practical application.

For example, the above-mentioned PBS has the drawbacks that it has a far lower resolution than polymethyl methacrylate, though having a radiation sensitivity ten times or more higher than said PMMA; has poor adhesion to a semiconductor substrate or mask substrate; is liable to be thermally decomposed, and consequently is little adapted for the application of dry etching indispensable for fabrication of high density device structures.

On the other hand, PMMA, in spite of its high resolution, also has the drawbacks that it has a low radiation sensitivity. When it is employed at relatively low radiation dosages, its high resolution has to be sacrificed. Consequently, it is unadapted for the practical quantity production of a semiconductor device, or photomask, particularly, a highly integrated circuit. Further, in order to improve the sensitivity of PMMA, attempts are made to employ high molecular weight PMMA. However, such high molecular weight PMMA can not be uniformly spin coated on a semiconductor substrate, and noticeably swells during development, leading to a decline in the precision with which the resist is patterned. Consequently, these attempts give rise to serious defeciencies in processability or resolution of PMMA. Studies have been made to develop other of poly (alkyl methacrylate) series having a higher radiation sensitivity than PMMA. However, various forms of poly (alkyl methacrylate) proposed to date are disadvantageous in that they are all inferior to PMMA in respect of resolution, and, when heated, bring about the deformation of the resultant resist pattern.

Hitherto, attempts have also been made to introduce a halogen element having a high radiation sensitivity into one of the side chains of an acrylate polymer to provide a positive resist highly sensitive to radiation. For example, there have been reported poly(methyl α-chloroacrylate) in which chlorine is substituted with the α-hydrogen of polymethyl acrylate, and poly(fluoro alkyl methacrylate) in which fluorine is substituted into the ester side chain. However, the poly(fluoroalkyl methacrylate) has the drawbacks that it has unsatisfactory heat resistance due to its low glass transition temperature, and poor adhesion to a semiconductor substrate, and is inferior to PMMA in respect of workability and resolution. On the other hand, although poly(methyl α-chloroacrylate) has a high glass transition temperature and good heat resistance, its sensitivity is only slightly increased compared with PMMA, and yet it is inferior to PMMA in respect of resolution.

SUMMARY OF THE INVENTION

It is accordingly the object of this invention to elevate radiation sensitivity of an acrylate positive resist without sacrificing its resolution, heat resistance, etch resistance and adhesion to a substrate.

To attain the above-mentioned object, this invention provides a radiation-sensitive positive resist prepared from a polymer whose main polymer unit is constituted by a halogenated alkyl α-halogenated acrylate monomer containing highly radiation-sensitive halogen elements in both side chains. The positive resist of this invention has the advantages that it has a resolution, heat resistance and etch resistance about the same as or even higher than those of the prior art PMMA; provides a high precision pattern by applying only about 1/10 to 1/100 of the amount of radiation used when PMMA is employed as a positive resist; and said pattern is adapted for the application of dry etching.

A radiation-sensitive positive resist embodying this invention is a homogeneous polymer of any one of the various forms of halogenated alkyl α-halogenated acrylate monomer or a copolymer of some of said various monomeric forms or a copolymer of any one of said various monomeric forms and any one of the undermentioned different forms of vinyl monomer.

The polymeric radiation-sensitive positive resist of the invention contains halogen atoms in a number accounting for 32% or less of the total number of the elements constituting the positive resist.

The halogenated alkyl α-halogenated acrylate monomer used as the raw material of the radiation-sensitive positive resist of this invention may be expressed by the general structural formula:

(I)

where:
X = fluorine, chlorine or bromine
R = alkyl group, aryl group, or alkoxy alkyl group each having 1 to 10 carbon atoms, with one or more hydrogen atoms substituted by the corresponding numbers of fluorine atoms.

The other vinyl monomers than the above-mentioned halogenated alkyl α-halogenated acrylate include:
(i) an acrylate monomer expressed by the general structural formula:

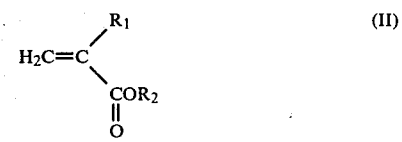
(II)

where:
$R_1$ = methyl group, halogenated methyl group, cyano group or halogen atom.

$R_2$ = hydrogen atom, alkyl group, aryl group, halogenated alkyl group or halogenated aryl group, each group having 1 to 10 carbon atoms (ii) a thiol acrylate monomer expressed by the general structural formula:

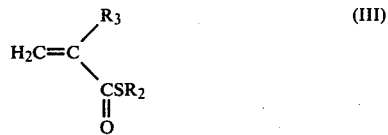

where:

$R_2$ = the same as defined above $R_3$ = methyl group, halogenated methyl group, halogen element, or cyano group, and (iii) a vinyl acetate monomer expressed by the general structural formula:

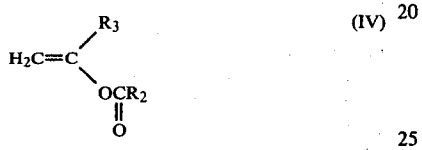

where:

$R_2$ and $R_3$ = the same as defined above

Other vinyl monomers than that which is expressed by the general structural formulas (II), (III) and (IV) include vinyl alcohol series monomers such as vinyl alcohol, isopropenyl alcohol and α-phenyl vinyl alcohol; vinyl ketone series monomers such as methyl isopropenyl ketone, trifluoromethyl isopropenyl ketone, trifluoroethyl isopropenyl ketone, and methyl α-chlorovinyl ketone; vinyl ether series monomers such as isopropenyl methyl ether, isopropenyl ethyl ether, and isopropenyl benzyl ether; ethylene 1, 1-substituted compounds such as methacrylonitrile, vinylidene fluoride, α-fluoro acrylonitrile and αmethyl styrene; and vinyl sulfone series monomers such as vinyl ethyl sulfone. However, more preferred among the above-listed other vinyl monomers are those which are expressed by the general structural formulas (II), (III) and (IV).

DETAILED DESCRIPTION OF THE PREFERRED EMBODIMENTS

The radiation-sensitive positive resist embodying this invention may be divided into the following groups:

(A) a homogeneous polymer of any one of the various forms of a halogenated alkyl α-halogenated acrylate monomer expressed by the general structural formula (I);

(B) a copolymer of two or more of the various forms of the halogenated alkyl α-halogenated acrylate monomer expressed by the general structural formula (I); and (C) a copolymer of any one of the various forms of the halogenated alkyl α-halogenated acrylate monomer expressed by the general structural formula (I) and any one of the various forms of the other vinyl monomers than those expressed by the general structural formula (I).

The subject positive resist belonging to the group (A) include, for example, poly(trifluoroethyl α-chloroacrylate), poly(trifluoroisopropyl α-chloroacrylate), poly(trifluoro-t-butyl α-chloroacrylate), poly(1,1-dimethyl pentafluoropropyl α-chloroacrylate), poly(1,1-dimethylheptafluorobutyl α-chloroacrylate), poly(1,1-dimethyltetrafluoropropyl α-chloroacrylate), poly(1,1-dimethylhexafluoro-butyl α-chloroacrylate), poly(trifluorobutyl α-chloroacrylate), poly(tetrafluorobutyl α-chloroacrylate), poly(trifluoropropyl α-chloroacrylate), poly(1-methoxy tetrafluorobutyl α-chloroacrylate), poly(1-methoxy trifluoroethyl α-chloroacrylate), poly(1-methoxy trifluoropropyl α-chloroacrylate), poly(1-ethoxy trifluoropropyl α-chloroacrylate), poly(meta-trifluoromethylbenzyl α-chloroacrylate), poly(para-trifluoromethylbenzyl α-chloroacrylate), poly(meta-trifluoromethylphenyl α-chloroacrylate), poly(para-trifluoromethylphenyl α-chloroacrylate), poly(trifluoroethyl α-fluoroacrylate), poly(trifluoroisopropyl α-fluoroacrylate), poly(t-butyl α-fluoroacrylate), poly(1,1-dimethylpentafluoropropyl α-fluoroacrylate), poly(1,1-dimethylpentafluorobutyl α-fluoroacrylate), poly(1-methoxytrifluoroethyl α-fluoroacrylate), poly(meta-trifluoromethylphenyl α-fluoroacrylate), poly(trifluoroethyl α-bromoacrylate), poly(trifluoroisopropyl α-bromoacrylate), and poly(paratrifluoromethylbenzyl α-bromoacrylate).

The subject positive resist belonging to the group (B) concretely includes a copolymer of trifluoroethyl α-chloroacrylate and trifluoroethyl α-fluoroacrylate, a copolymer of trifluoroethyl α-chloroacrylate and trifluoro-t-butyl α-fluoroacrylate, a copopolymer of trifluoro-t-butyl α-chloroacrylate and pentafluoropropyl α-chloroacrylate, a copolymer of trifluoroethyl α-chloroacrylate and meta-trifluoromethylphenyl α-chloroacrylate, a copolymer of trifluoro-t-butyl α-chloroacrylate and para-trifluoromethylphenyl α-fluoroacrylate, a copolymer of trifluoroethyl α-chloroacrylate and 1,1-dimethylheptafluorobutyl α-chloroacrylate, a copolymer of trifluoro-t-butyl α-chloroacrylate and 1-methyl-pentafluoropropyl α-chloroacrylate, and a copolymer of trifluoroethyl α-chloroacrylate and 1,1-dimethylheptafluorobutyl α-chloroacrylate.

Among the subject positive resist belonging to the group (C), the copolymers of the monomers expressed by the general structural formula (I) and those expressed by the general structural formula (II) include, for example, a copolymer of trifluoroethyl α-chloroacrylate and methyl methacrylate, a copolymer of trifluoroethyl α-chloroacrylate and t-butyl methacrylate, a copolymer of trifluoroethyl α-chloroacrylate and phenyl methacrylate, a copolymer of trifluoroethyl α-chloroacrylate and phenyl α-chloroacrylate, a copolymer of trifluoroethyl α-chloroacrylate and t-butyl α-chloroacrylate, a copolymer of trifluoroethyl α-chloroacrylate and methacrylic acid, a copolymer of trifluoroethyl α-chloroacrylate and heptafluorobutyl methacrylate, a copolymer of trifluoroethyl α-chloroacrylate and methyl α-trifluoromethylacrylate, a copolymer of trifluoroethyl α-chloroacrylate and trichloroethyl α-chloroacrylate, a copolymer of trifluoroethyl α-chloroacrylate and t-butyl α-fluoroacrylate, a copolymer of trifluoroethyl α-chloroacrylate and methyl α-fluoroacrylate, a copolymer of trifluoroethyl α-chloroacrylate and trichloroethyl methacrylate, a copolymer of trifluoro-t-butyl α-chloroacrylate and t-butyl α-chloroacrylate, and a copolymer of trifluoro-t-butyl α-chloroacrylate and t-butyl methacrylate.

The subject positive resists which are copolymers of the monomers expressed by the general structural formula (I) and those expressed by the general structural formula (III) include, for example, a copolymer of trifluoroethyl α-chloroacrylate and methyl thiolmethacrylate, a copolymer of trifluoroethyl α-chloroacrylate and trifluoroethyl thiolmethacrylate, a copolymer of trifluoroethyl α-chloroacrylate and methyl α-trifluoromethylthiolacrylate, a copolymer of α-chlorotrifluoroethyl acrylate and methyl α-chlorothiolacrylate, a copolymer of trifluoro-t-butyl α-chloroacrylate and t-butyl α-chlorothiolacrylate, and a copolymer of trifluoroethyl α-chloroacrylate and t-butyl thiolmethacrylate.

The subject positive resists which are copolymers of the monomers expressed by the general structural formula (I) and those expressed by the general structural formula (IV) include, for example, a copolymer of trifluoroethyl α-chloroacrylate and isopropenyl acetate, a copolymer of trifluoro-t-butyl α-chloroacrylate and isopropenyl trifluoroacetate, and a copolymer of 1,1-dimethylpentafluoropropyl α-chloroacrylate and α-chlorovinyl acetate.

Referring to the copolymer of the subject positive resist belonging to the aforesaid group (C), copolymers of monomers expressed by the general formula (I) and those expressed by any of the general structural formulas (II), (III), and (IV) are superior to copolymers of monomers expressed by the general formula (I) and a different form of vinyl monomer such as vinyl alcohol series monomers in respect of resolution, etch resistance and heat resistance. With respect to the copolymer of the group (C), the amount of the monomer of halogenated alkyl α-halogenated acrylate expressed by the general structural formula (I) should preferably account for 50 mol % or more of the total quantity of said copolymer.

With the positive resist of this invention, a number of halogen atoms is chosen to account for 32% or less of the total number of elements included in the polymer constituting said positive resist. If the number of halogen atoms exceeds 32%, the kinds of developer and solvent will have to be selected within an extremely restricted range, causing the resultant positive resist to lose adhesion to a substrate. Obviously, the positive resist materials of the invention can be polymerized by the customary process.

Even a mixture of the polymers of the previously described groups (A), (B), (C) with the prior art positive resist such as poly(olefine sulfone) or poly (methyl methacrylate) can provide a radiation-sensitive positive resist fully meeting all the aforesaid requirements.

There will now be described a concrete process of patterning a radiation-sensitive positive resist embodying this invention.

First, the radiation-sensitive positive resist is dissolved in a proper solvent, for example, methyl cellosolve acetate to prepare a resist solution. The resist solution is uniformly spread over a semiconductor substrate or mask substrate, for example with a resist thickness of about 0.1 to 2 microns by a spinner coating process. Later, the resist layer is prebaked under a prescribed condition, for example, at a temperature of 160° to 250° C. Radiation is emitted on the desired portions of the positive resist layer for patterning. This pattering can be effected by either the direct or the indirect process. The direct process is to apply electron beams on the resist layer, being externally controlled in the prescribed form and scan. The indirect process is to set a properly patterned mask between a resist layer and a source of radiation and emit radiation such as electron beams, deep ultraviolet rays, X-rays, γ-rays or α-rays on the resist layer through the patterned mask. Thereafter, only those portions of the resist layer which are exposed to radiation are selectively removed either by wet development such as the dip or spray process using, for example, a mixed developer of methyl isobutyl ketone and isopropyl alcohol or by dry development based on, for example, plasma gas.

The polymer constituting the radiation-sensitive positive resist of this invention mainly consists of an acrylate series monomer containing halogen atoms in both side chains. Therefore, it is assumed that the present positive resist has been improved in the development characteristic, and interaction between the above-mentioned polymer and radiation has been intensified, thereby elevating the radiation sensitivity of said positive resist. The acrylate series polymer constituting the positive resist of this invention always includes a monomer expressed by the general structural formula (I) and contains a halogen atom on the α-position of the acrylate polymer. As compared with a positive resist formed of a similar acrylate series polymer lacking a halogen atom on the α-position, therefore, the present positive resist has a higher glass transition temperature, and consequently more prominent heat resistance, etch resistance and workability. The polymer constituting the positive resist of this invention well serves the purpose if it has such an average molecular weight as does not obstruct application property, or concretely an average molecular weight of scores of thousands to several millions. The polymer of the present positive resist need not be polymerized to a particularly high degree.

As described above, the radiation-sensitive positive resist of this invention is easy to handle and can be increased in radiation sensitivity without sacrificing its resolution, heat resistance and etch resistance. Consequently the positive resist of this invention can be applicable for high precision dry process patterning as well as conventional wet process patterning with only about 1/10 or less radiation dosage than required for the prior art of PMMA.

This invention will be more fully understood by reference to the examples which follow.

EXAMPLE 1

Poly(2,2,2-trifluoroethyl α-chloroacrylate) prepared by the conventional radical polymerization ($M_N = 4.63 \times 10^4$, $M_W = 20.6 \times 10^4$) was dissolved in a solvent of methyl cellosolve acetate to provide a 10% solution of a positive resist. The resist solution thus prepared was spread over the surface of a silicon wafer while it was rotated, thereby forming a resist layer with a thickness of 0.5 micron. The resist layer was prebaked for 60 minutes at a temperature of 200° C. Electron beams were irradiated for patterning on the desired portions of the prebaked resist layer with an acceleration voltage of 20 KV. The resist layer was developed with a mixed developer formed of methylisobutyl ketone and isopropyl alcohol (blended in the ratio of 3:2) to remove those portions of said resist layer which were exposed to electron beams, thereby forming a patterned resist layer on the silicon wafer.

Controls 1 to 3

Three patterned posiresist layers were formed on a silicon wafer in the same manner as in Example 1, using three resist solutions of poly(methyl methacrylate), poly(methyl α-chloroacrylate) and poly (2,2,2-trifluoroethyl methacrylate), respectively.

Determination was made of a radiation dosage required fully to remove those portions of the resist layers produced in Example 1 and Controls 1 to 3 which were exposed to electron beams, the results being set forth in Table 1 below.

TABLE 1

| Sample | Positive resist | Average molecular weight ($\times 10^4$) | Sensitivity to electron beams ($C/cm^2$) |
|---|---|---|---|
| Example 1 | poly(2,2,2-trifluoroethyl α-chloroacrylate) | 20.6 | $9 \times 10^{-7}$ |
| Control 1 | Poly(methyl methacrylate) | 44.1 | $5 \times 10^{-5}$ |
| Control 2 | Poly(methyl α-chloroacrylate) | 23.4 | $2 \times 10^{-5}$ |
| Control 3 | Poly(2,2,2-trifluoro-ethyl methacrylate) | 51.3 | $5 \times 10^{-6}$ |

As seen from Table 1 above, the positive resist of this invention indicated a radiation sensitivity about 50 times higher than that of the prior art poly(methyl methacrylate) positive resist, and also a radiation sensitivity several times or more than 10 times higher than poly(methyl α-chloroacrylate) and poly(2,2,2-trifluoroethyl methacrylate) both containing one or more halogen atoms only in one side chain, thus proving that a positive resist prepared from an acrylate series polymer containing halogen atoms in both side chains such as the material of the positive resist of this invention has an extremely high radiation sensitivity.

EXAMPLE 2 poly (2,2,2-trifluoroethyl α-chloroacrylate) was dissolved in methyl cellosolve acetate to provide 10% solution of a positive resist in the same manner as in Example 1. Said solution was spread over the surface of a chromium mask substrate while it was rotated, thereby forming a resist layer with a thickness of 0.8 micron. The resist layer was prebaked for 60 minutes at a temperature of 200° C. Electron beams whose diameter was chosen to be 0.1 micron were emitted on the desired portions of the prebaked positive resist at the dose of 1.2 $\mu c/cm^2$ with acceleration voltage of 20 KV, thereby patterning the prebaked positive resist. The positive resist was developed with a mixed developer consisting of methylisobutyl ketone and isopropyl alcohol blended in the ratio of 3:2 to selectively remove those portions of the positive resist which were exposed to electron beams, thereby providing a patterned resist layer on the chromium mask substrate. The patterned resist layer was proved to be free from surface roughening and have prominently high patterning precision of the order of a submicron.

Thereafter the patterned positive resist layer mounted on the chromium mask substrate was postbaked 10 minutes at 100° C. A chromium layer exposed from the patterned resist layer was dry etched 10 minutes by argon ions emitted at the rate of 0.65 $mA/cm^2$ with an acceleration voltage of 500 V in an atmosphere evacuated to an extent of $2 \times 10^{-9}$ Torr.

After the patterned resist layer was removed by $O_2$ plasma, a pattern the same as that of the positive resist layer was transcribed with high precision on the chromium mask substrate from which the patterned resist layer was removed, thus proving that the positive resist of this invention was adapted for the dry process patterning.

A patterned positive resist layer was formed of poly(butene-1-sulfone) with a thickness of 0.8 micron in the same manner as in Example 2. A chromium substrate was dry etched through said patterned resist layer. When dry etching was continued 5 minutes, the patterned resist layer vanished, proving that the positive resist of poly(butene-1-sulfone) was unadapted for application of the ion beam etching process.

EXAMPLES 3 TO 7

Five radiation-sensitive patterned positive resist layers were formed on silicon wafers in the same manner as in Example 1, except that the compounds listed in Table 2 below were used as the positive resist. Determination was made of a radiation dosage (or radiation sensitivity) required to completely remove those portions of the respective positive resists which were exposed to electron beams, the results being set forth in Table 2 below.

TABLE 2

| Example | Positive resist | Average molecular weight ($\times 10^4$) | Radiation sensitivity ($\mu c/cm^2$) |
|---|---|---|---|
| 3 | Poly(trifluoroisopropyl α-chloroacrylate) | 21.5 | 1.2 to 3.0 |
| 4 | Poly(trifluoro-t-butyl α-chloroacrylate) | 20.8 | 1.0 to 3.0 |
| 5 | Poly(1,1-dimethyl pentafluoropropyl α-chloroacrylate) | 20.0 | 0.4 to 2.0 |
| 6 | Poly(1,1-dimethyl heptafluorobutyl α-chloroacrylate) | 18.7 | 0.5 to 3.0 |
| 7 | Poly(1-methoxy pentafluoropropyl α-chloroacrylate) | 38.2 | 1.5 to 3.0 |

EXAMPLES 8 TO 11

Four patterned radiation-sensitive positive resist layers were formed on a silicon wafer in the same manner as in Example 1, except that the compounds listed in Table 3 below were used as the positive resist. Determination was made of a radiation dosage (or radiation sensitivity) required to completely remove those portions of the respective positive resists which were exposed to electron beams, the results being also indicated in Table 3 below.

TABLE 3

| Example | Positive resist | Average molecular weight ($\times 10^4$) | Radiation sensitivity ($\mu c/cm^2$) |
|---|---|---|---|
| 8 | Copolymer of trifluoroethyl α-chloroacrylate and trifluoroethyl α-fluoroacrylate (mixed in the ratio of 50:50) | 37.5 (40) | 0.5 to 2.0 |
| 9 | Copolymer of trifluoroethyl α-chloroacrylate and metatrifluoromethylbenzyl α-chloroacrylate (mixed in the ratio of 80:20) | 28.9 | 1.5 to 4.0 |
| 10 | Copolymer of trifluoro-t-butyl α-chloroacrylate and trifluoro-t-butyl α-fluoroacrylate (mixed in the ratio of 60:40) | 32.4 | 0.8 to 1.8 |
| 11 | Copolymer of trifluoroethyl α-chloroacrylate and 1,1-dimethyl-heptafluorobutyl | 25.3 | 0.5 to 1.5 |

TABLE 3-continued

| Example | Positive resist | Average molecular weight ($\times 10^4$) | Radiation sensitivity ($\mu c/cm^2$) |
|---|---|---|---|
| | α-chloroacrylate (mixed in the ratio of 60:40) | | |

EXAMPLES 12 TO 22

Eleven patterned radiation-sensitive positive resist layers were formed on a silicon wafer in the same manner as in Example 1, except that the compounds listed in Table 4 below were used as the positive resist. Determination was made of a radiation dosage (or radiation sensitivity) required to completely remove those portions of the respective posiresist layers which were exposed to electron beams, the results being indicated in Table 4 below.

TABLE 4

| Example | Positive resist | Average molecular weight ($\times 10^4$) | Radiation sensitivity ($\mu c/cm^2$) |
|---|---|---|---|
| 12 | Copolymer of trifluoroethyl α-chloroacrylate and hexafluoroisopropyl methacrylate (mixed in the ratio of 80:20) | 25.1 | 0.4 to 1.8 |
| 13 | Copolymer of trifluoroethyl α-chloroacrylate and pentafluoropropyl methacrylate (mixed in the ratio of 50:50 | 34.9 | 0.8 to 2.0 |
| 14 | Copolymer of trifluoroethyl α-chloroacrylate and isopropenyl acetate (mixed in the ratio of 80:20) | 51.4 | 0.9 to 3.0 |
| 15 | Copolymer of trifluoroethyl α-chloroacrylate and t-butyl methacrylate (mixed in the ratio of 70:30) | 50.5 | 0.5 to 2.0 |
| 16 | Copolymer of trifluoroethyl α-chloroacrylate and t-butyl α-chloroacrylate (mixed in the ratio of 70:30) | 49.2 | 0.4 to 2.0 |
| 17 | Copolymer of trifluoroethyl α-chloroacrylate and trichloroethyl α-chloroacrylate (mixed in the ratio of 60:40) | 38.5 | 0.8 to 1.8 |
| 18 | Copolymer of trifluoroethyl α-chloroacrylate and phenyl α-chloroacrylate (mixed in the ratio of 70:30) | 40.1 | 3.0 to 6.0 |
| 19 | Copolymer of trifluoro-t-butyl α-chloroacrylate and α-methylstyrene (mixed in the ratio of 80:20) | 31.1 | 4.0 to 6.0 |
| 20 | Copolymer of trifluoroisopropyl α-chloroacrylate and methacrylonitrile (mixed in the ratio of 70:30) | 36.7 | 1.0 to 1.8 |
| 21 | Copolymer of trifluoroethyl α-chloroacrylate and methyl methacrylate (mixed in the ratio of 80:20) | 56.8 | 1.5 to 2.5 |
| 22 | Copolymer of trifluoroethyl α-chloroacrylate and methacrylic acid (mixed in the ratio of 95:5) | 47.7 | 2.0 to 3.0 |

EXAMPLES 23–26 AND REFERENCE SAMPLE

Five patterned radiation sensitive positive resist layers were formed on a silicon wafer in the same manner as in Example 1, except that the compounds listed in Table 5 below were used as the positive resist and a deuterium lamp was applied as a source of light to emit deep ultraviolet rays. Determination was made of a radiation dosage (or radiation sensitivity) required to completely remove those portions of the respective positive resist layers which were exposed to deep ultraviolet rays, the results being set forth in Table 5 below, and data on the prior art poly(methyl methacrylate) positive resist being also given therein for reference.

It is seen from Table 5 that the positive resists of this invention have a sensitivity to deep ultraviolet rays 5 to 6 times higher than that of the prior art poly(methyl methacrylate) positive resist.

TABLE 5

| Sample | Positive resist | Average molecular weight ($\times 10^4$) | Radiation sensitivity ($J/cm^2$) |
|---|---|---|---|
| Example 23 | Poly(trifluoroethyl α-chloroacrylate) | 20.6 | 0.15 |
| 24 | Poly(trifluoroisopropyl α-chloroacrylate) | 21.5 | 0.20 |
| 25 | Poly(trifluoro-t-butyl α-chloroacrylate | 20.8 | 0.25 |
| 26 | Copolymer of trifluoroethyl α-chloroacrylate and methyl isopropenyl ketone (mixed in the ratio of 70:30) | 16.9 | 0.12 |
| Reference | Poly(methyl methacrylate) | 44.1 | 0.9 |

The patterns of positive resists produced in Examples 1 to 26 have as high a resolution as less than 1 micron, proving that the positive resist of this invention could provide a sufficiently high precision pattern for manufacture of a highly integrated circuit.

As described above, the radiation-sensitive positive resist of this invention has the advantages that it has a far higher radiation sensitivity than, and substantially as high a resolution as, the prior art radiation-sensitive poly(methyl methacrylate); and prominent heat resistance and etch resistance, proving to be well adapted for dry process patterning and conequently for practical application.

What we claim is:

1. A semiconductor substrate or a mask substrate having coated thereon a coating of a radiation-sensitive positive resist polymer or copolymer, said polymer or copolymer being prepared from at least 50 mol % of one or more halogenated alkyl α-halogenated acrylate monomers expressed by the general structural formula:

where:
X = fluorine, chlorine or bromine,
R = alkyl group, aryl group or alkoxy alkyl group which have 1 to 10 carbon atoms and in which one or more hydrogen atoms are substituted by the corresponding number of fluorine atoms;

and wherein halogen atoms are contained in a number accounting for 32 percent or less of the total number of elements constituting said polymer or copolymer;

said coating having been formed by a process comprising:
(a) forming a resist layer from said polymer or copolymer on a semiconductor substrate or mask substrate;
(b) prebaking said resist layer at an elevated temperature;
(c) irradiating selected portions of said prebaked layer for patterning; and
(d) removing said selected portions of said resist layer.

2. A manufacture according to claim 1, wherein said polymer or copolymer is a copolymer prepared from at least one vinyl monomer differing from said formula (I).

3. A manufacture according to claim 2, wherein said at least one vinyl monomer is at least one selected from the group consisting of (a) a monomer expressed by the general structural formula:

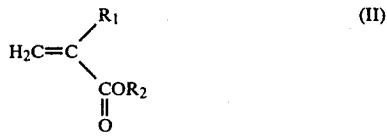

where:
$R_1$ = methyl group, halogenated methyl group, cyano group or halogen element,
$R_2$ = hydrogen atom, or alkyl group, aryl group, halogenated alkyl group or halogenated aryl group, each group containing 1 to 10 carbon atoms;

(b) a monomer expressed by the general structural formula:

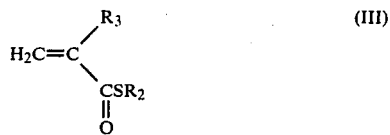

where:
$R_2$ = the same as defined above,
$R_3$ = methyl group, halogenated methyl group, halogen elements, or cyano group; and (c) a monomer expressed by the general structural formula:

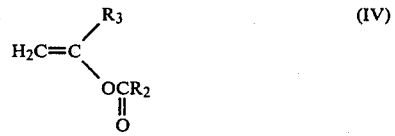

where:
$R_2$ and $R_3$ = the same as defined above.

4. A manufacture according to claim 2, wherein said at least one vinyl monomer is at least one selected from the group consisting of isopropenyl alcohol, α-phenyl vinyl alcohol, vinyl ketones, vinyl ethers, methacrylonitrile, vinylidene fluoride, α-fluoroacrylonitrile, α-methyl styrene, and vinyl sulfones.

5. A manufacture according to claim 1, wherein said resist layer was formed on said semiconductor substrate or mask substrate by dissolving said polymer or copolymer in a solvent to prepare a resist solution and coating said resist solution over said semiconductor substrate or mask substrate.

* * * * *